United States Patent
Goto et al.

(10) Patent No.: US 10,495,146 B2
(45) Date of Patent: Dec. 3, 2019

(54) ZNO COATING METHOD FOR ROLLING BODY, ROLLING BODY WITH ZNO COATING, AND BEARING INCORPORATING SAME

(71) Applicant: NATIONAL INSTITUTE FOR MATERIALS SCIENCE, Ibaraki (JP)

(72) Inventors: Masahiro Goto, Ibaraki (JP); Michiko Sasaki, Ibaraki (JP); Akira Kasahara, Ibaraki (JP); Masahiro Tosa, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 16/070,554

(22) PCT Filed: Aug. 25, 2016

(86) PCT No.: PCT/JP2016/074857
§ 371 (c)(1),
(2) Date: Jul. 17, 2018

(87) PCT Pub. No.: WO2017/126150
PCT Pub. Date: Jul. 27, 2017

(65) Prior Publication Data
US 2019/0017549 A1    Jan. 17, 2019

(30) Foreign Application Priority Data
Jan. 19, 2016   (JP) .................................. 2016-008111

(51) Int. Cl.
*F16C 33/34* (2006.01)
*C23C 14/08* (2006.01)
(Continued)

(52) U.S. Cl.
CPC ............ *F16C 33/34* (2013.01); *C23C 14/086* (2013.01); *C23C 14/505* (2013.01); *C23C 14/354* (2013.01); *F16C 2223/30* (2013.01)

(58) Field of Classification Search
CPC ....... F16C 33/32; F16C 33/34; F16C 2230/30; F16C 33/42
See application file for complete search history.

(56) References Cited

U.S. PATENT DOCUMENTS

| | | | |
|---|---|---|---|
| 6,110,347 A | 8/2000 | Arao et al. | |
| 6,391,386 B1* | 5/2002 | Nishiuchi | C23C 14/16 427/250 |
| 2013/0206038 A1* | 8/2013 | Goto | C23C 14/086 106/243 |

FOREIGN PATENT DOCUMENTS

| | | |
|---|---|---|
| JP | 4-282871 | 10/1992 |
| JP | 11-117091 | 4/1999 |

(Continued)

OTHER PUBLICATIONS

International Search Report dated Sep. 27, 2016 in International Application No. PCT/JP2016/074857.

(Continued)

*Primary Examiner* — James Pilkington
(74) *Attorney, Agent, or Firm* — Wenderoth, Lind & Ponack, L.L.P.

(57) ABSTRACT

ZnO sputtering is performed while a rolling body is housed in a basket made of a metal wire and is rotated. By setting a ratio of a mesh size of the basket to a diameter of the rolling body in a range of 40 to 95%, fine and uniform ZnO coating can be formed on a surface of the rolling body. By using the rolling body with ZnO coating prepared in this manner in a bearing which is rotated at high speed in a (Continued)

high-load state, a friction coefficient can significantly be lowered in comparison with a case of no coating.

10 Claims, 17 Drawing Sheets

(51) Int. Cl.
*C23C 14/50* (2006.01)
*C23C 14/35* (2006.01)

(56) References Cited

FOREIGN PATENT DOCUMENTS

JP 2010-209443 9/2010
WO 2012/039264 3/2012

OTHER PUBLICATIONS

M. Goto et al., "Frictional Property of Zinc Oxide Coating Films Observed by Lateral Force Microscopy", Japanese Journal of Applied Physics, 42, 4834-4836 (2003).
M. Goto et al., "Reduction in Frictional Force of ZnO Coatings in a Vacuum", Japanese Journal of Applied Physics, 47, 8914-8916 (2008).
M. Goto et al., "Low-Friction Coatings of Zinc Oxide Synthesized by Optimization of Crystal Preferred Orientation", Tribology Lett., 43 (2) 155-162 (2011).
Y. Miyakawa et al., "Optimum sputtering conditions for molybdenium disulfide", Tribologist, 38 (1) 46-53 (1993), with Machine Translation.
http://www.gmn.de/en/ball-bearings/products/deep-groove-ball-bearings/product-search.html.
http:/www.matsuda-shouten.co.jp/productlist/shell/leaflet/aeroshell/AeroShell_Turbine_Oil_500.pdf, with Machine Translation.
Masahiro Tosa et al., "Development of Low Frictional Coating under High Temperature Environment", NIMS NOW, Apr. 2013, vol. 13, No. 3, whole No. 136, p. 6, with English Version.
Masahiro Tosa et al., "Junkatsukei Ceramic Coating", The Surface Science Gakujutsu Koenkai Yoshishu, The Surface Society of Japan, Dec. 1, 2015, (Dec. 1, 2015), Session ID: 2Fp03, with Machine Translation.
Masahiro Goto et al., "Application of a low frictional ZnO to ball bearings", The 76th JSAP Autumn Meeting Lecture proceedings (2015 Nagoya International Conference Hall), 13p-4E-19, with Machine Translation.
Green Tribology niokeru Shinsozai / Zairyo Sosei to Oyo, No. 339, Nov. 2015, with Machine Translation.
Notice of Reasons for Refusal dated Jun. 18, 2019 in corresponding Japanese Patent Application No. 2017-562425, with Machine Translation.
Masahiro Tosa et al., "Frictional properties of zinc oxide coatings", Abstracts of Lecture on Surface Science, The 32nd Surface Science Conference, Session ID:22Aa01R, Japan Society of Surface Science and Technology, 2012, 8 pages, including Machine Translation.

* cited by examiner

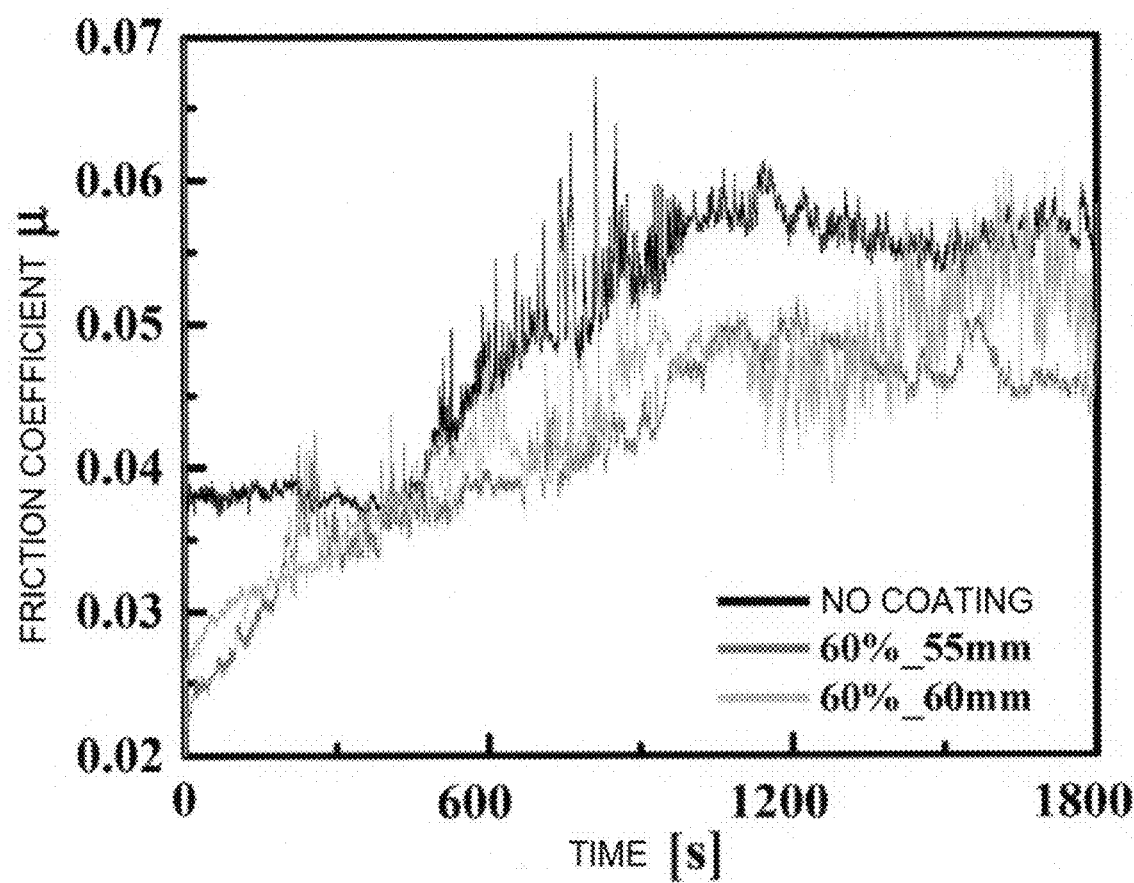

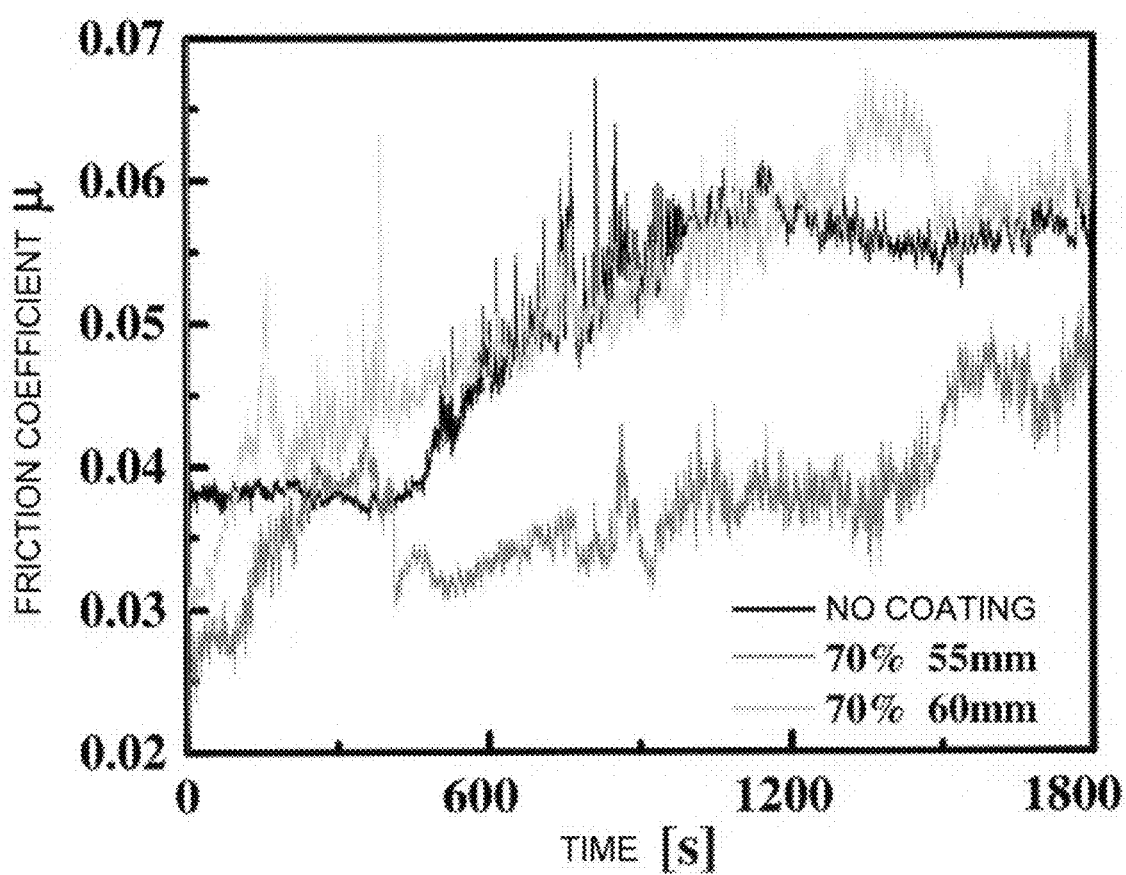

(a)

(b)

ZNO COATING METHOD FOR ROLLING BODY, ROLLING BODY WITH ZNO COATING, AND BEARING INCORPORATING SAME

TECHNICAL FIELD

The present invention relates to a ZnO coating method for rolling body and more specifically relates to a method for achieving ZnO coating effective for lowering friction of a bearing for use under severe conditions and a rolling body with ZnO coating suitable for such a bearing or the like. The present invention also relates to a bearing incorporating such a rolling body as a rolling element.

BACKGROUND ART

A bearing is used to lower friction of a mechanical driving unit in various fields. For example, it is known that over one-hundred bearings are used in an automobile. Improvement in performance of the bearings directly leads to improvement in power performance of an engine and contributes to energy reduction resulting from lowering of a frictional force.

The present inventors discovered in 2003 that control of crystalline orientation of ZnO coating developed lowering of a frictional force at a nano level due to Coulomb repulsion caused by a piezoelectric effect (Non Patent Literature 1) and clarified in 2008 that the low-friction phenomenon occurred under a vacuum environment at a macro level as well (Non Patent Literature 2). The present inventors thereafter succeeded in developing this low-friction phenomenon in oil as well (Non Patent Literature 3). Since ZnO is an oxide, ZnO is excellent in chemical stability, can be used under a high-temperature and high-humidity environment, and is almost harmless to a human body. Thus, ZnO is advantageous in that an influence of scattering of abrasion powder on a living environment can be reduced.

The bearing is one of core parts used to support the shaft. Breakage of even one of the bearings in a device can cause not only a stop of the device but also serious destruction and ignition of the device. In this manner, although the bearing is required to have high reliability, the bearing is often used for a long period under severe conditions such as high load, high-speed rotation, and high temperature. Accordingly, a method for forming firm ZnO coating highly uniformly over the entire spherical surface of the rolling element is one of core techniques essential to achievement of a low friction bearing with ZnO coating.

However, the ZnO coating disclosed in the aforementioned Non Patent Literatures is one provided on a planar surface, and the Non Patent Literature does not disclose a method for forming ZnO coating on the entire spherical surface such as a rolling element of a bearing. When coating is to be provided on surfaces of an object in all directions including the upper, lower, right, and left directions, coating the object while the object is being floated in free space is not realistic unless the cost and the processing speed can be ignored, and the object to be coated thus needs to be coated in a state of contacting another object. However, this causes a problem in which coating such a contact point and portions around the contact point is prevented from being formed. Thus, forming coating while a contact point is moved is conceivable. In this case, however, friction and collision with another object occurring on the surface of the object at the time of moving the contact point cause damage of the coating which is in the middle of formation and is not firm enough, which is an obstacle to formation of uniform and firm coating. Further, it is considerably difficult to provide a coating substance uniformly to the surfaces in all directions and keep other coating conditions for the entire surfaces evenly.

Patent Literature 1 describes a rolling element depositing method invented by the present inventors, which is not ZnO coating. In this depositing method, a holder formed in a coil spring shape or a mesh shape is prepared, and deposition is performed while the holder housing a spherical or cylindrical object is rotated. Patent Literature 1 discloses that a coil-spring-like holder is used, and that $MoS_2$ is successfully coated on the entire surface of a cylindrical bearing rolling element by means of magnetron sputtering.

However, $MoS_2$ is known as a substance which has long been used as a solid lubricant, which can form a coating film for friction lowering on a surface of an object extremely easily, and which can be coated so easily that adjustment of sputtering conditions can substantially be dispensed with in a case of coating by means of sputtering. As for $MoS_2$, which can be coated under highly variable sputtering conditions, a large number of experiments described in Non Patent Literature 4 shall be referred to, for example. Hence, it is apparent to those skilled in the art that there is no guarantee of enabling a method for coating $MoS_2$ to be applied to ZnO coating, which has more strict coating conditions than the $MoS_2$ coating.

In addition, as is apparent from a commercially available lubricating sprayer using an oily liquid in which $MoS_2$ particles are dispersed, attaching the $MoS_2$ particles to the surface of an object by means of sliding is widely performed as one of methods for forming the $MoS_2$ coating film. Thus, contact and collision of the cylindrical bearing rolling element to be coated with the coil-spring-like holder or another bearing rolling element occurring in the process of coating formation performed in an embodiment in Patent Literature 1 may be rather advantageous to $MoS_2$ coating. However, unlike the $MoS_2$ coating, since ZnO coating cannot be formed by means of sliding, it is natural to regard contact and collision of the surface to be coated with another object during the ZnO coating as being disadvantageous in consideration of the possibility of damage of the ZnO coating, which is still fragile in the middle of formation. Furthermore, as described in the aforementioned Non Patent Literatures, it is important to control crystalline orientation of the ZnO coating to use the ZnO coating for friction lowering. Physical disturbance in the process of coating formation such as the contact and the collision may inhibit the necessary control of the crystalline orientation and be disadvantageous to achievement of coating with uniform crystalline orientation.

SUMMARY OF INVENTION

Technical Problem

An object of the present invention is to solve the aforementioned conventional technical problem, to provide a method for forming uniform and firm ZnO coating on a surface of a rolling body such as a bearing rolling element, and to provide a rolling body with such ZnO coating.

Solution to Problem

According to an aspect of the present invention, a rolling body comprising a specular ZnO coating film on an entire surface thereof is provided.

In the rolling body, the ZnO coating film may have a columnar structure on a ZnO (002) face.

Further, the rolling body may be formed in a shape selected from the group consisting of a sphere, a cylinder, and a truncated cone.

Further, the rolling body may be a rolling element for a bearing.

According to another aspect of the present invention, a bearing incorporating the rolling body is provided.

According to still another aspect of the present invention, there is provided a ZnO coating method for rolling body comprising performing ZnO sputtering while rotating a basket housing a rolling body to form ZnO coating on a surface of the rolling body, wherein a ratio of a mesh size of the basket to a radius of the rolling body is in a range of 40% to 95%.

In the ZnO coating method for rolling body, the sputtering may be performed by means of radio frequency magnetron sputtering.

Further, sputter gas made of oxygen and argon may be used, and Zn may be used as a target.

Further, an oxygen partial pressure ratio in the sputter gas may be in a range of 60% to 80%.

Further, a vertical distance from a planar surface including a surface of the target to an outside of the basket may be in a range of 55 mm to 85 mm.

Advantageous Effects of Invention

According to the present invention, uniform and firm ZnO coating can be formed on a surface of a rolling body formed in a shape such as a sphere, a cylinder, and a truncated cone that can be used in a bearing or the like.

BRIEF DESCRIPTION OF DRAWINGS

FIG. 8A is a graph illustrating temporal changes of friction coefficients of the bearing in air incorporating the bearing ball with ZnO coating according to the example of the present invention prepared with use of the oxygen-and-argon-mixed sputter gas with the oxygen partial pressure ratio of 60% (distance h=55 mm and 60 mm) in comparison with a case of the bearing incorporating the bearing ball with no ZnO coating.

FIG. 8C is a graph illustrating temporal changes of friction coefficients of the bearing in air incorporating the bearing ball with ZnO coating according to the example of the present invention prepared with use of the oxygen-and-argon-mixed sputter gas with the oxygen partial pressure ratio of 70% (distance h=55 mm and 60 mm) in comparison with a case of the bearing incorporating the bearing ball with no ZnO coating.

DESCRIPTION OF EMBODIMENTS

Figure 1:
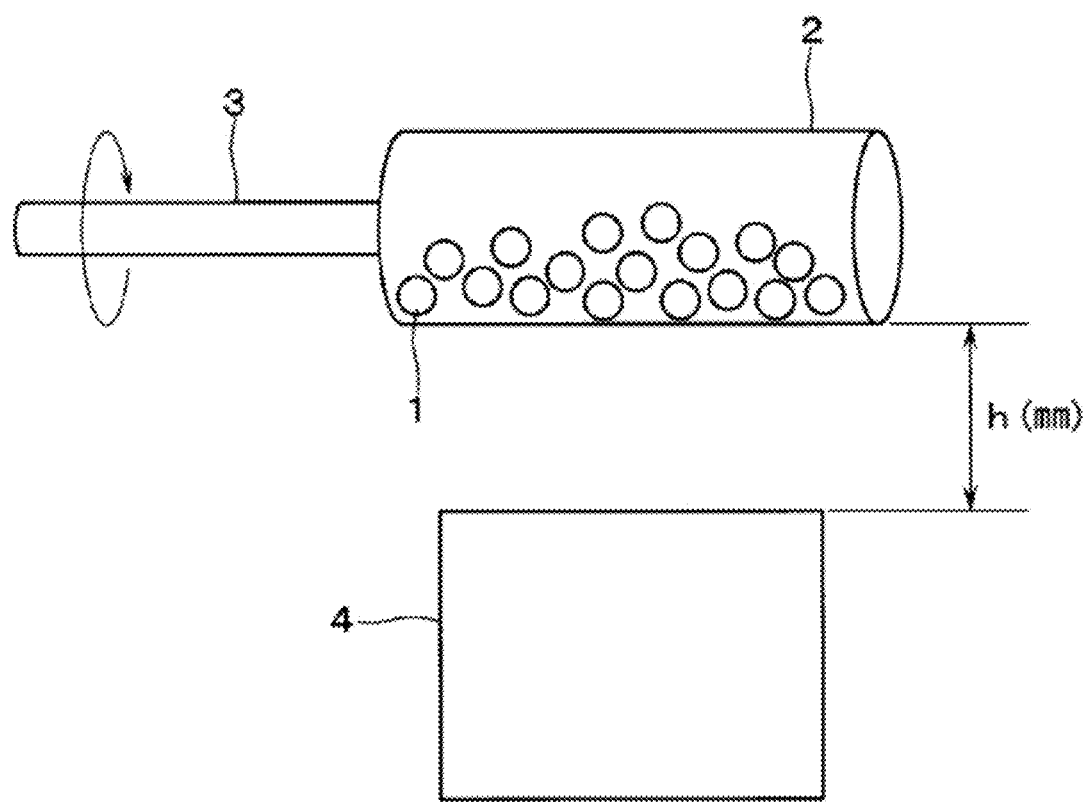
FIG. 1 is a schematic view of a device used to perform ZnO coating in an example of the present invention.

At first, the present inventors attempted to form uniform and firm ZnO coating on the surface of a rolling element by housing the rolling element into a basket-like holder and performing sputtering while rotating the holder in accordance with Patent Literature 1 only to obtain a low-quality result that was obviously not for use as low-friction coating even in a case in which the coating was formed. Under such circumstances, the present inventors attempted to obtain favorable coating by changing conditions for applying an external force to the coating which was in the middle of formation. In the process of trial and error, the present inventors changed the mesh size of the basket used as the holder to adjust the aforementioned external force and arrived at the present invention upon discovering that favorable coating was obtained in a case in which, when a sphere was used as the rolling element, the mesh size was in a range of 40% to 95%, more preferably in a range of 50% to 80%, of the diameter of the sphere. It is to be noted that, in the present description, the mesh size is defined as a shortest distance between two adjacent wires out of wires forming the basket. Further, a material for the wires is not particularly limited and may be metal, for example.

One of the reasons why the mesh size influences the quality of the ZnO coating in the above manner is that, in a case in which the mesh is too fine, the sphere will excessively contact the mesh, that is, the probability and frequency of contact of the surface of the coating on the sphere with the wires constituting the mesh will increase, which will have an adverse effect on the coating, and that, conversely, in a case in which the mesh is too coarse, and in which the mesh size is close to the diameter of the sphere, the sphere will easily be fitted into the mesh, which will prevent smooth rolling of the sphere.

However, in consideration of the fact that the contact area between the sphere and the mesh tends to increase further as the mesh is finer, a force applied to the contact portion on the surface of the sphere is smaller as the mesh is finer, which is rather preferable for formation of favorable coating. Such a way of thinking can be established. Thus, in this respect, a value as high as 95%, which is the upper limit of the ratio of the mesh size to the diameter of the sphere (mesh size:diameter), is an unexpected value. In addition, the reason why adjusting the ratio has a large influence on formation of favorable ZnO coating is intuitively unclear. Further, as for 40%, which is the lower limit of the preferable range of the ratio, the mesh size which significantly inhibits a flight of the sputter material from the sputter target to the surface of the sphere is normally estimated as a much smaller mesh size than 40% although the mesh size depends on the diameter of the wire forming the basket. In this respect, 40%, which is the lower limit of the preferable ratio, can also be an unexpected value based only on Patent Literature 1. In Patent Literature 1, which only provides an embodiment of coating of $MoS_2$, which can be film-formed very easily, it is not necessary to adjust the relationship between the mesh size and the size of the object to be coated, and an idea of such adjustment does not exist.

Meanwhile, sputter gas used as atmosphere at the time of sputtering can be mixed gas of oxygen and argon. The oxygen partial pressure ratio in the sputter gas is preferably in a range of 80% to 80%. Further, the vertical distance from the planar surface including the surface of the target for the sputter gun used in sputtering to the outside of the basket is preferably in a range of 55 mm to 85 mm.

In the present invention, the shape of the rolling body to be coated is not limited to the sphere and includes a cylindrical shape and a tapered shape (truncated cone). In a case in which the rolling body is a cylinder, the diameter of the circle which is an end surface of the cylinder is used as the diameter in the ratio of the mesh size to the diameter. When the ratio is in the above range, favorable ZnO coating can be obtained. Further, in a case in which the rolling body is a truncated cone, the diameter of the larger circle out of the end surfaces of the truncated cone is used as the diameter in the ratio. Accordingly, in the present description, in a case in which "the ratio of the mesh size to the diameter" is referred to, as the diameter, the diameter of the sphere, the diameter of the circle on the end surface of the cylinder, and the diameter of the larger circle out of the end surfaces of the truncated cone are used when the rolling bodies to be coated are the sphere, the cylinder, and the truncated cone, respectively.

According to the present invention, a rolling body provided with specular, fine, and firm ZnO coating is provided. Since ZnO is a metal oxide, the fine and firm coating functions as an antioxidant film under a high-temperature and high-humidity environment, for example. This is effective for duration extension of a rolling element of this kind used in a bearing operated under severe conditions. Further, since the ZnO coating provided according to the present invention is specular, the friction coefficient is low as a matter of course. The friction coefficient can further be lowered by adjusting the crystal orientation. Furthermore, since ZnO has piezoelectric characteristics, a rolling body having piezoelectric characteristics can be provided.

Further, according to the present invention, a method for forming specular, fine, and firm ZnO coating on a rolling body used as a rolling element, for example, has been clarified for the first time. This method has a characteristic of enabling the surface of the rolling body to be coated while suppressing coating problems such as damage and lack of uniformity and fineness of the coating. Furthermore, in this method, since the ZnO coating can be applied to the surface of the rolling body under similar conditions to optimal conditions at the time of the ZnO coating on the planar surface by means of sputtering disclosed in the aforementioned Non Patent Literature, the method is advantageous to its prompt practical application. Further, since the basket used in the coating processing has a simple structure and is formed to facilitate attachment to and detachment from the sputter device, the method is easily carried out. In addition, rolling bodies are housed in a basket, the basket is attached, the basket is detached in a state in which the basket contains the coated rolling bodies, and preparation for coating of the subsequent lot can be started immediately. By preparing a plurality of baskets each containing rolling bodies, the throughput at the time of forming the ZnO coating according to the present invention on a large amount of rolling bodies can be kept high. This method has such an advantage.

EXAMPLES

In examples, ZnO low-friction coating was applied to a bearing ball, and the coating itself formed on the spherical surface of the bearing ball and the bearing ball with the ZnO coating were evaluated. It is to be noted that, although examples of coating on the spherical surface are shown here, the present invention can also be applied to coating on the surface of a rolling body which is not the sphere such as a cylindrical rolling body and a truncated conical rolling body.

To achieve a high-performance low-friction bearing ball by applying the low-friction ZnO sputter coating film (Non Patent Literature 1 to 3) which has been provided by the present inventors to a curved surface such as a spherical surface, it is first important to control crystal orientation of the film as described above to exert a low-friction effect on the ZnO coating. The following description shows that, by appropriately setting sputter conditions, crystal orientation which brings about low friction was successfully achieved on a curved surface. Another important thing is how to evaluate performance of the bearing ball member which has achieved significant friction lowering due to the ZnO coating discovered by the present inventors. Hereinbelow, how these have been achieved will, be described specifically.

A schematic view of a device used to perform ZnO coating in the present example is illustrated in FIG. 1. In the present example, bearing balls 1 to be ZnO-coated were housed in a cylindrical basket 2 made of a metal wire mesh, and ZnO was sputtered on the bearing balls 1 by supplying ZnO from a sputter gun 4 while driving a rotating shaft 3 to rotate the basket 2. As a target for ZnO coating, the bearing ball 1 for a commercially available angular bearing was used, and a high-performance low-friction bearing was achieved.

[Film Formation of ZnO Coating]

As the angular bearing, HY S6000 manufactured by GMN (bearing inside diameter: 10 mm, outside diameter: 26 mm; for detailed specifications such as dimensions, refer to Non Patent Literature 5) was used. The bearing ball 1 was made of $Si_3N_4$ ceramic for high temperature and had a diameter of 4.762 mm. The bearing balls 1 were housed in the meshed and cylindrical basket 2 as illustrated in FIG. 1. The diameter of a wire constituting the basket 2 was 0.55 mm$\phi$, and the mesh size (distance between two wires) was 2.6 mm. Thus, mesh size/diameter was 2.6 mm/4.762 mm×100=54.59 ... ≈55%. While the basket 2 containing the bearing balls 1 was rotated slowly, a ZnO film having a thickness of 300 nm was coated uniformly on the front surfaces of the balls by means of magnetron sputtering. As film forming conditions, a Zn disk was used as a target, the RF was 100 W, the sputter gas was a mixture of oxygen and argon (oxygen partial pressure ratio: 60%, 70%), no bias was applied, and the samples were not heated. A distance h between the sputter gun 4 and each of the samples was changed in several ways to form a film. The distance h was a vertical distance from the planar surface including the surface of the target for the sputter gun 4 to the outside of the basket 2. Further, as many balls 1 as the number that did not cause overlap were housed in the basket 2 to prevent the distance between the sputter gun 4 and each of the bearing balls 1 serving as the samples from differing per bearing ball 1.

Figure 2:
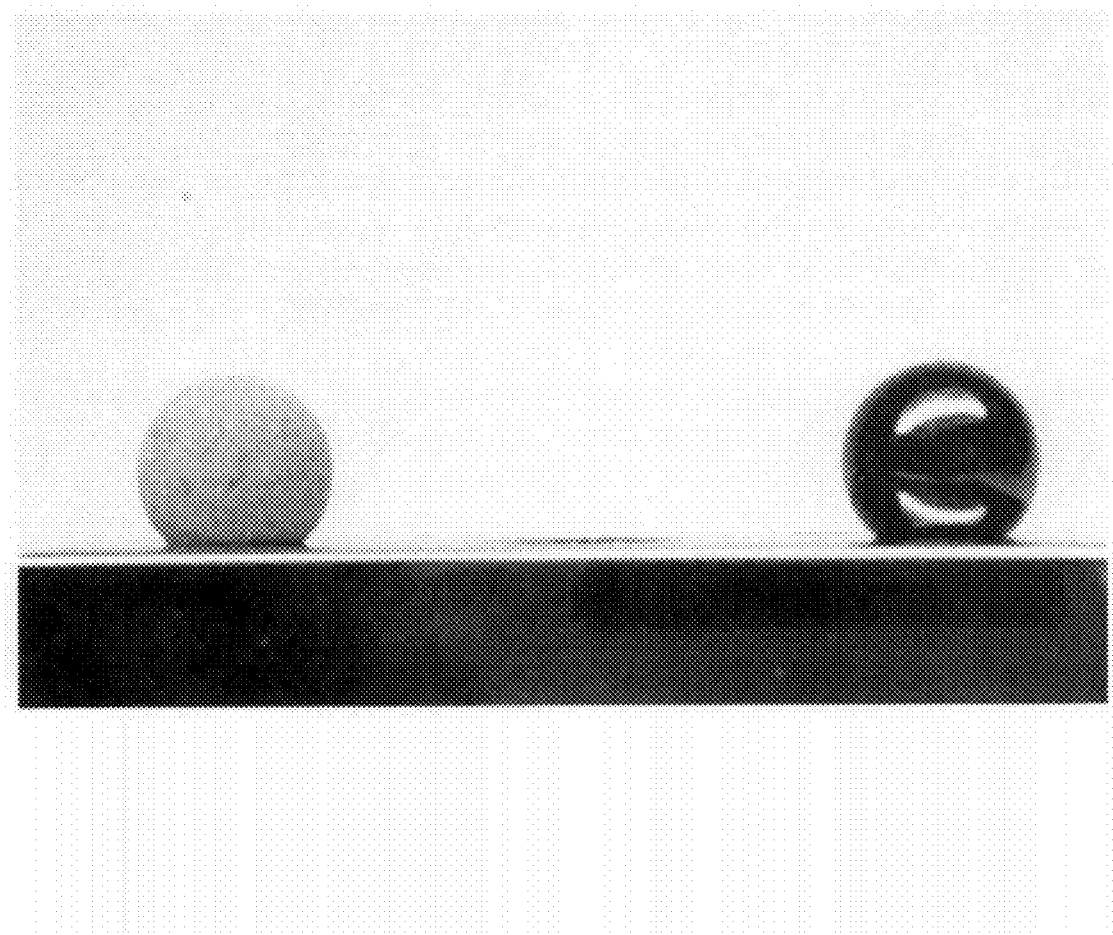
FIG. 2 illustrates photos of an example (right) of a bearing ball on which favorable coating has been formed by a device for ZnO coating in FIG. 1 and a failed example (left).

A photo of the bearing ball coated in this manner is shown on the right side of FIG. 2. As can easily be seen in the photo, the entire surface of the bearing ball is perfectly specular and is provided with uniform and fine coating (the rear surface of the bearing ball, which is hidden and cannot be seen in FIG. 2, is perfectly specular in a similar manner). On the other hand, as is apparent from a failed example shown on the left side of FIG. 2, the surface thereof is not specular but diffuses light and is not uniform. The surface also has visually apparent unevenness, and the coating is exfoliated and cracked. Meanwhile, when coating of the ZnO film was performed by changing the ratio of the mesh size to the diameter of the sphere and other film forming conditions, the ball had similar appearance to one on the left side of FIG. 2 in a case in which formation of the specular coating was failed.

[Evaluation for ZnO-Coated Bearing Ball (Observation by Means of TEM, Use Test in Jet Engine)]

Figure 3:
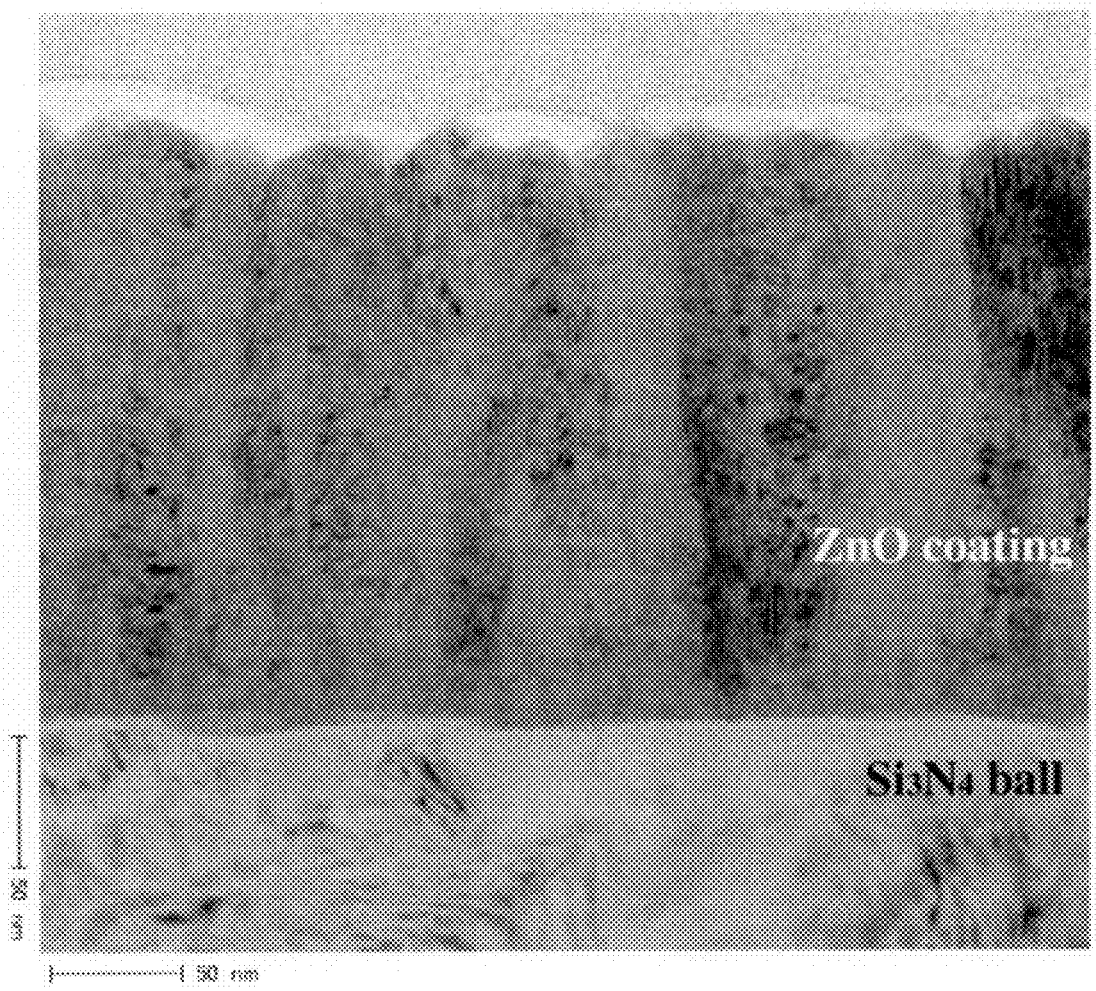
FIG. 3 is a cross-sectional TEM image of a bearing ball with ZnO coating according to the example of the present invention prepared with use of oxygen-and-argon-mixed sputter gas with an oxygen partial pressure ratio of 60%.
Figure 4:
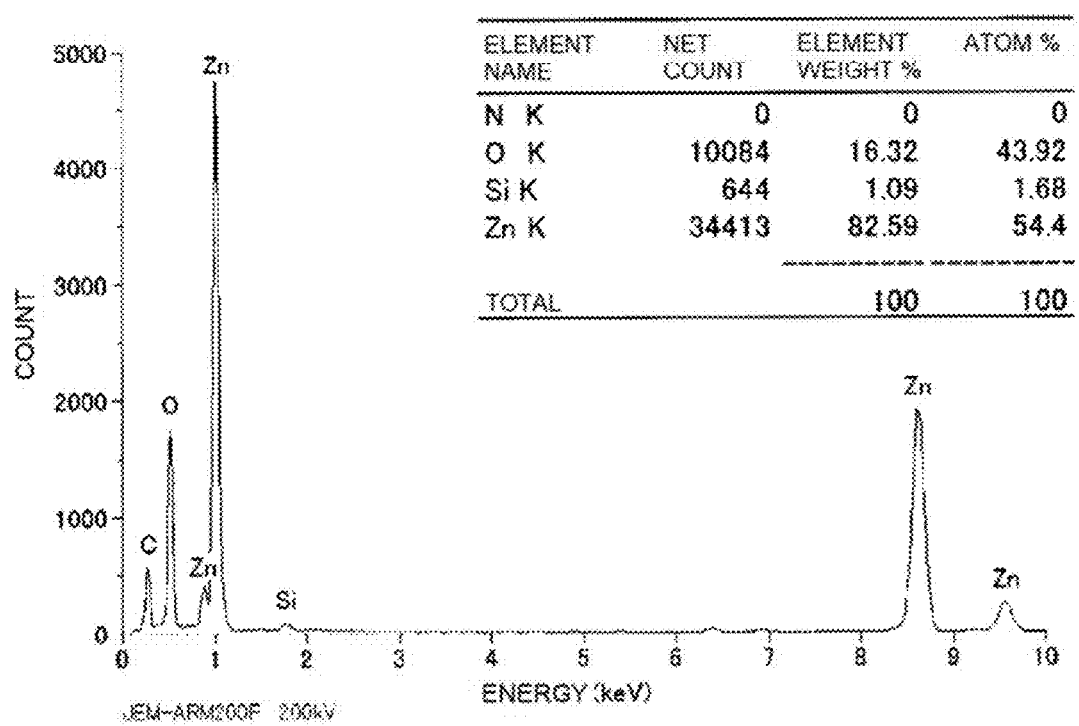
FIG. 4 illustrates an EDX analysis result of the ZnO coating illustrated in FIG. 3.

A cross-sectional TEM image of the ZnO coating ball prepared with the distance h of 55 mm (oxygen partial pressure ratio: 60%) is illustrated in FIG. 3. It was confirmed in FIG. 3 that, in the ZnO coating film (ZnO coating) on the surface of the bearing ball ($Si_3N_4$ ball), a columnar structure on the ZnO (002) face, which was important to exertion of the low-friction effect, was generated. An EDX analysis result thereof is illustrated in FIG. 4. As can be seen from this analysis result, Zn is 54.4%, O is 43.92%, and the composition ratio is almost 1:1. It was proved that the film was ZnO coating.

The bearing ball provided with ZnO coating in the above manner was returned to original position to reassemble the bearing. The bearing was placed into a small-sized jet engine, and the jet engine was intermittently operated for about half a day. To lubricate the bearing for this operation, a mixture of kerosene and oil for turbine at a mixture ratio of 6 to 7% (a can of oil for turbine (946 mL) for 13.5 to 14 L of kerosene) was used. Specifically, as the oil for turbine, high-performance turbine oil for an aircraft engine and an aero-derivative private power generation and marine gas turbine engine, AeroShell Turbine Oil 500 (ASTO500), was used (AeroShell is a registered trademark for Shell Brands International Aktiengesellschaft). For the details of the oil for turbine, refer to Non Patent Literature 6.

Figure 5:
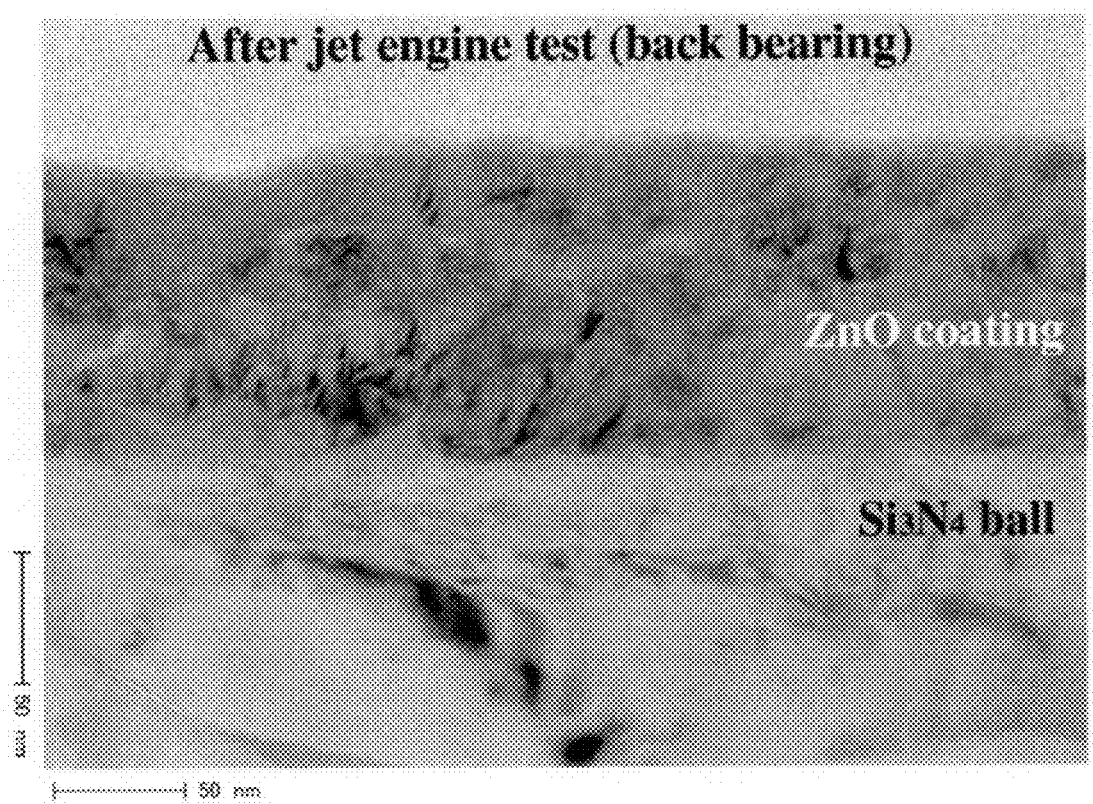
FIG. 5 is a cross-sectional TEM image of the bearing ball with ZnO coating prepared under the same conditions as those of the bearing ball illustrated in FIG. 3 after the bearing ball is used in a jet engine.

Thereafter, the bearing ball was taken out, and a cross-sectional TEM image was obtained in a similar manner. The image "After jet engine test (back bearing)" is illustrated in FIG. 5. The coating film (ZnO coating) illustrated in FIG. 4 was left even after use in the jet engine, and it was confirmed that the film endured this test under the strict conditions. Further, it was found that the columnar crystal columns were changed into crystal grains in places. In this manner, it was clarified that, even after the extremely severe endurance test, the ZnO coating was left, and that the crystal orientation was changed. Accordingly, it was confirmed that, although the bearing ball was used under such severe conditions as to change the crystal orientation, the coating film was simply abraded, and sudden destruction in a state in which the coating film was left, such as exfoliation, did not occur. That is, it was found from the present example that the coating was firmly attached, and that high-reliability low-friction coating having very high duration prediction performance was achieved. However, ideal crystal orientation exerting original performance was changed into different crystal orientation.

[Evaluation for Bearing Ball with ZnO Coating (Observation by Means of TEM, Friction Coefficient in Air and in Oil)]

A bearing incorporating the bearing ball with ZnO coating prepared above was attached to a friction tester via a jig dedicated to bearings and was rotated to measure temporal changes of a friction coefficient during the rotation. Thereafter, the bearing ball was taken out, and a cross-sectional TEM image thereof was captured, to perform performance evaluation. In this performance evaluation, a wide-range load friction and wear tester, TYPE: 35, manufactured by SHINTO Scientific Co., ltd. was used as a friction tester, and the evaluation was performed in air atmosphere (temperature: 26° C., humidity: 54%) and in oil atmosphere (kerosene to which the aforementioned turbine oil (AeroShell Turbine Oil 500) was added by 6%). Further, the number of times of rotation was 3000 rpm, and the load was 20 kgW. It is to be noted that, since the tester did not have a jig for evaluating bearings, a jig dedicated to bearings prepared by the present applicant was used.

Figure 9:
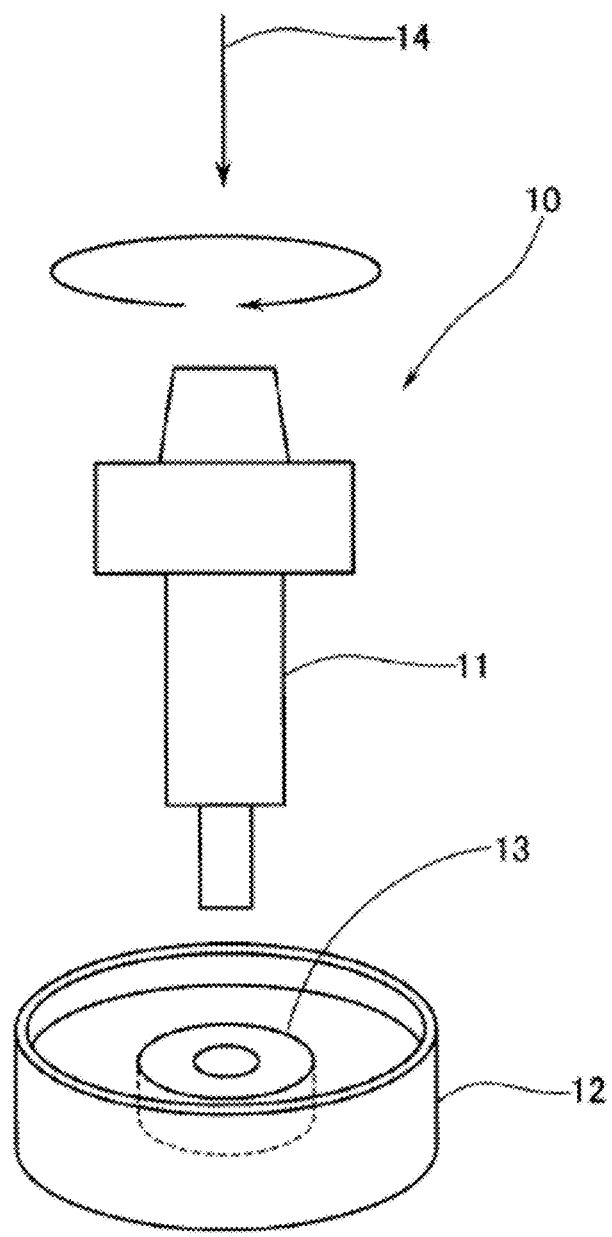
FIG. 9 illustrates a schematic view and a use state of a bearing-dedicated jig for attaching the bearing to the friction tester used to evaluate the bearing incorporating the bearing ball with ZnO coating according to the present invention.

A schematic view of this-bearing-dedicated jig is illustrated in FIG. 9, and specific structure views thereof are illustrated in FIGS. 10A to 10E. A bearing shaft 11 serving as an upper component of a bearing-dedicated jig 10 schematically illustrated in FIG. 9 is connected to a main shaft 14 of an upper rotation and load unit (friction tester), and rotation and load from the friction tester are transmitted to a bearing 13 to be tested housed in a housing 12 serving as a lower component of the jig 10. Meanwhile, the reason why only the upper surface portion of the bearing 13 is drawn with solid lines while the lower portion is drawn with dashed lines in FIG. 9 is that the portion other than the upper surface cannot be seen since the bearing 13 is secured in a bearing housing portion, which is a recess provided at the center part of the housing 12 (the detail will be described below). In using this jig 10, the bearing 13 is buried into a lower hole of the housing 12 constituting the jig 10 and is secured by claws from the upper side. Meanwhile, although the figures do not illustrate the claws and illustrate a state in which the bearing 13 is secured only by bolts (bearing securing screws 20 in FIG. 10C), the bearing 13 is actually tightened by the bolts and the claws, and the outside ring of the bearing 13 is secured by the claws. It is to be noted that the bearing 13 may be secured only by the bearing securing screws 20. The jig 10 is configured to enable the bearing 13 and the rotating rod (bearing shaft 11) at the upper portion of the jig to be secured with the center axes thereof aligned. The temperature changes during the test can be measured by a thermocouple. The thermocouple can be installed on the outer ring of the bearing 13 and secured by means of the aforementioned claws. Further, a thin-wall cylindrical portion 12a having a height of 40 mm located further on the upper side than the upper surface of the bearing 13 in the bearing attaching block (housing 12) is a transparent plastic cylindrical case, and a transparent plastic cylindrical member and a ring-like packing at the lower end of the cylindrical member are screwed into a portion of the housing 12 and are secured at the base portion of the housing 12. In this manner, since the upper portion of the housing 12 is in a cylindrical shape, and a connecting portion of the cylindrical member with the housing 12 is sealed by the ring-like packing, the housing 12 can have liquid held therein, and an experiment in which the bearing 13 is rotated in the housing 12 filled with oil can be performed. Furthermore, since the cylindrical case is transparent, a state during the test can be observed visually.

After the end of the test, the bearing 13 needs to be detached from the bearing-dedicated jig 10. As described above, to prevent the bearing shaft 11 provided in the bearing-dedicated jig 10 and the center of the rotating portion of the bearing 13 from being misaligned, clearance between a bearing housing portion 23 in the jig 10 and the bearing 13 is small. Further, since strong pressure is applied from the upper side during the test, the bearing 13 will be fitted into the housing portion 23 strongly after the end of the test. Thus, it is normally quite difficult to pull the bearing 13 by hand after the end of the test. Hence, this bearing-dedicated jig 10 is provided with a structure illustrated in FIG. 10B to enable the bearing 13 to be pulled easily.

Figure 10A:
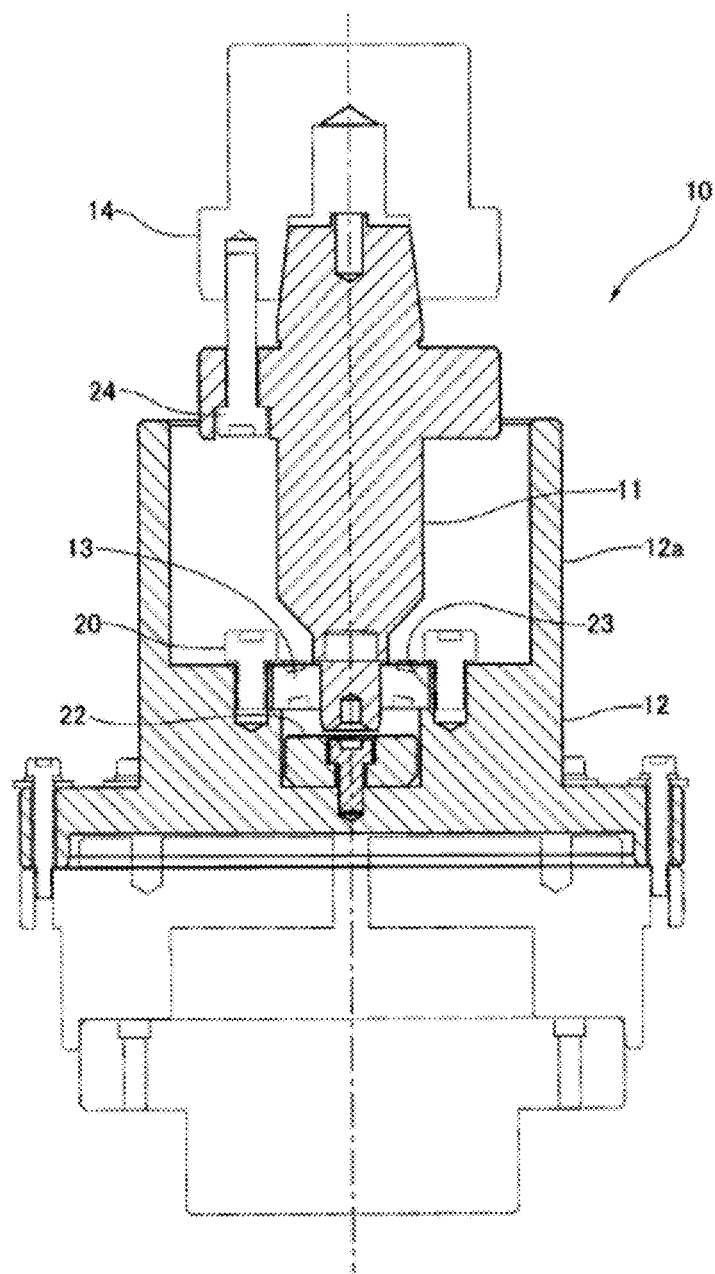
FIG. 10A is a front-side cross-sectional view of the bearing-dedicated jig in a tested state.
Figure 10B:
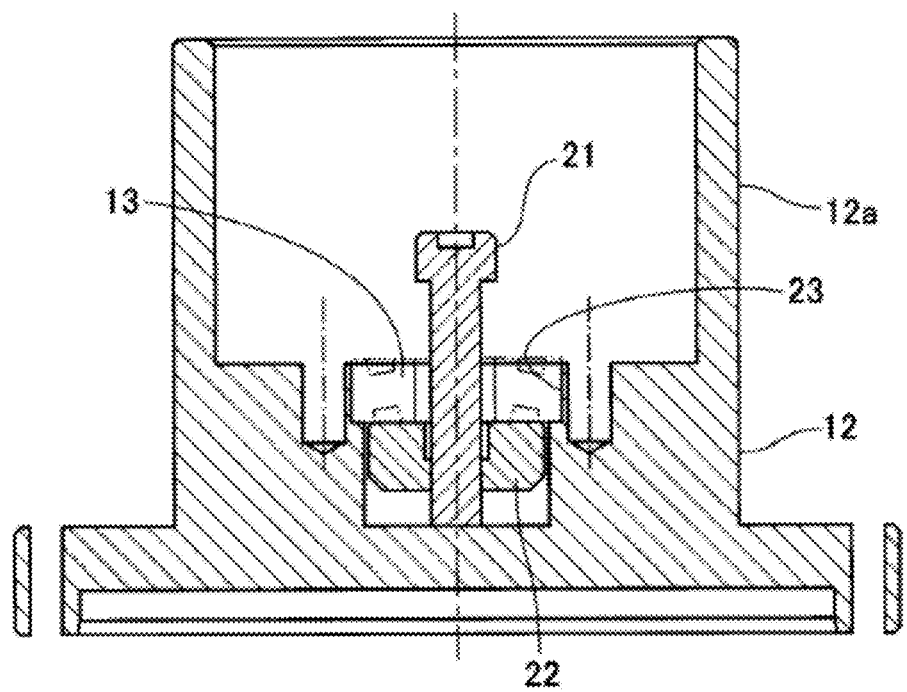
FIG. 10B is a front-side cross-sectional view of a housing constituting the bearing-dedicated jig to illustrate a state of a bearing pulling operation after the end of measurement.
Figure 10C:
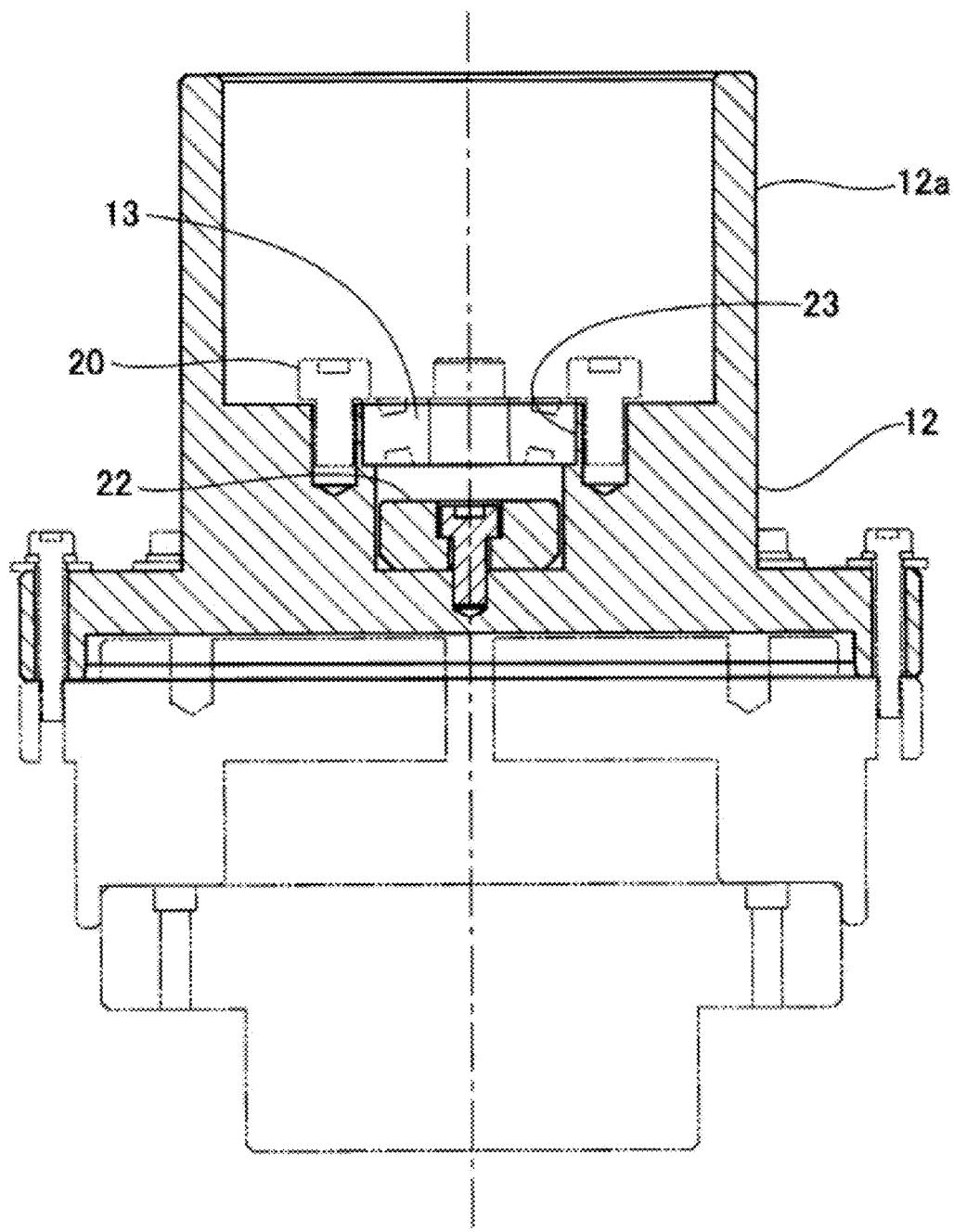
FIG. 10C is a front-side cross-sectional view of the housing constituting the bearing-dedicated jig.
Figure 10D:
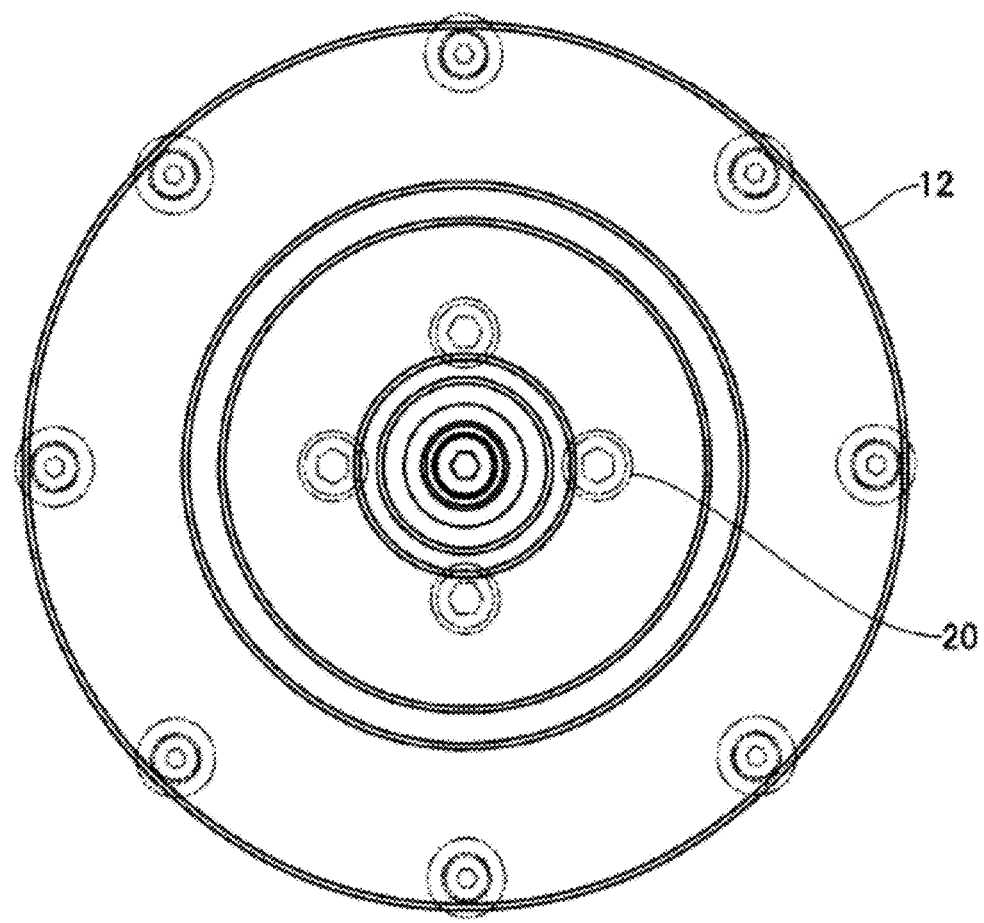
FIG. 10D is an upper view of the housing constituting the bearing dedicated jig.

In FIG. 10B, when a bearing pulling screw 21 is inserted through the center hole of the bearing 13 and is screwed into the center portion of a bearing pulling jig 22, the bearing pulling jig 22 is elevated together with the bearing 13 mounted thereon. In this manner, the bearing 13, which has been fitted strongly, can be pulled easily.

The procedure of attachment of the bearing 13 to the bearing-dedicated jig 10, a bearing test, and detachment of the bearing 13 from the bearing-dedicated jig 10 will be described more specifically below. When the test bearing 13 is to be attached to the bearing housing portion 23 in the bearing-dedicated jig 10, a cut-out recess formed in the bearing pulling jig 22 and a protrusion formed in the bearing housing portion 23 are aligned, and the bearing 13 is attached to the bottom of the bearing housing portion 23 located at the center of the housing 12 as illustrated in FIG. 10A. By attaching the bearing 13 so that the recess and the protrusion may be aligned and fitted with each other, rotation of the bearing pulling jig 22, which may occur at the time of detaching the bearing 13, can be restricted. It is to be understood that the recess and the protrusion may be provided at the opposite members of those described above. Subsequently, the lower end of a bearing-shaft-side jig (bearing shaft 11) (FIG. 10E), whose upper end has been engaged with and has temporarily been connected to the main shaft 14 of the friction tester main body in advance, is inserted into and engaged with the bearing 13. Further, at this time, the test bearing 13 is secured with use of the bearing securing screws 20 and the claws in a manner described above. Furthermore, at this time, the thermocouple or the like can be attached as needed.

Figure 10E:
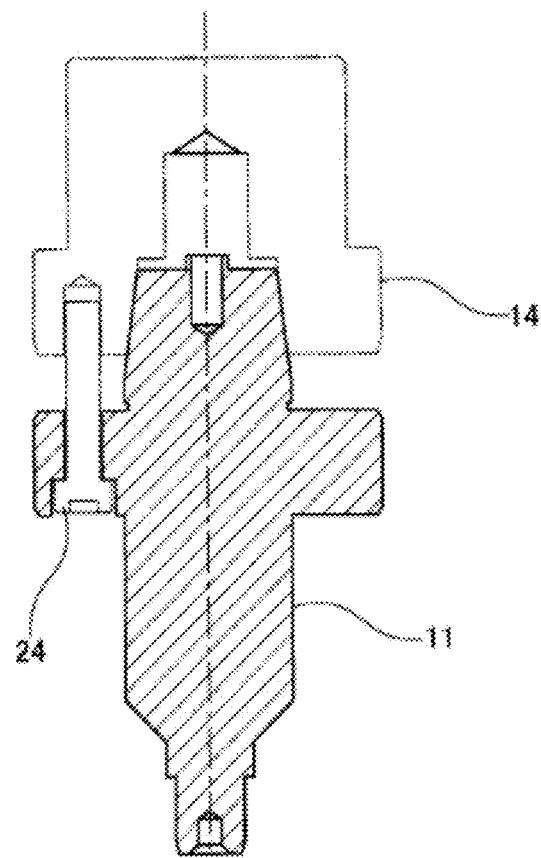
FIG. 10E (a) is a front-side cross-sectional view of a bearing shaft constituting the bearing-dedicated jig, and FIG. 10E (b) is a bottom view of a portion of the bearing shaft connected to the bearing seen from the bottom.
Figure 10E:
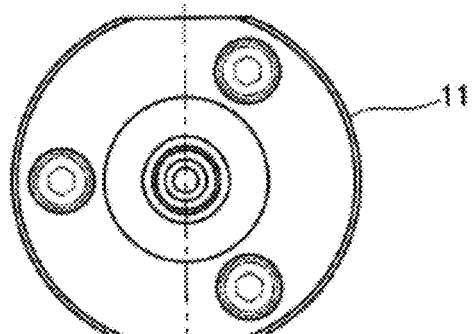

At this stage, the upper end of the bearing shaft 1 and the main shaft 14 of the friction tester main body, which are temporarily connected, are secured by a bolt (jig securing screw 24) as illustrated in FIG. 10E. As a result, these members are completely connected, and centering is completed. Thus, a rotating force from the friction tester main body can reliably be transmitted via the bearing shaft 11 to the bearing 13. As illustrated in FIGS. 10A and 10E, the upper portion of the bearing shaft 11 is tapered and is structured to facilitate alignment between the bearing shaft 11 and the main shaft 14 of the friction tester main body. Accordingly, by using the jig 10, since the bearing shaft 11 can completely be secured after the bearing shaft 11 is aligned with the bearing 13, centering of the main shaft 14 of the friction tester, the bearing shaft 11, and the bearing 13 can reliably be performed without special attention or skill. Such an effect can be obtained.

In this manner, after the bearing 13 is reliably attached to the friction tester main body so that the rotation centers of the members may accurately correspond, the test of the bearing 13 is started.

When the test of the bearing 13 is finished, the jig securing screw 24 is first detached, and engagement between the bearing shaft 11 and the main shaft is then released. Further, engagement between the bearing shaft 11 and the bearing 13 is released, and the bearing securing screws 20 securing the circumference of the bearing 13 to the housing 12 and a thermocouple securing screw are detached. Thereafter, the bearing pulling male screw 21 to be engaged with a female screw provided on the central inner wall of the bearing pulling jig 22 is inserted into the bearing 13 from the upper side and is rotated. Thus, the bearing pulling male screw 21 goes downward, and the tip end thereof abuts on the bottom of the bearing housing portion and applies a downward force to the bottom. When the bearing pulling male screw 21 is kept rotated, the bearing pulling jig 22 is not rotated due to the aforementioned engagement between the recess and the protrusion, and the bearing 13 is elevated together with the bearing pulling jig 22 from the bearing housing portion 23. In this manner, the bearing 13 can be detached from the bearing-dedicated jig 10 easily.

Figure 6A:
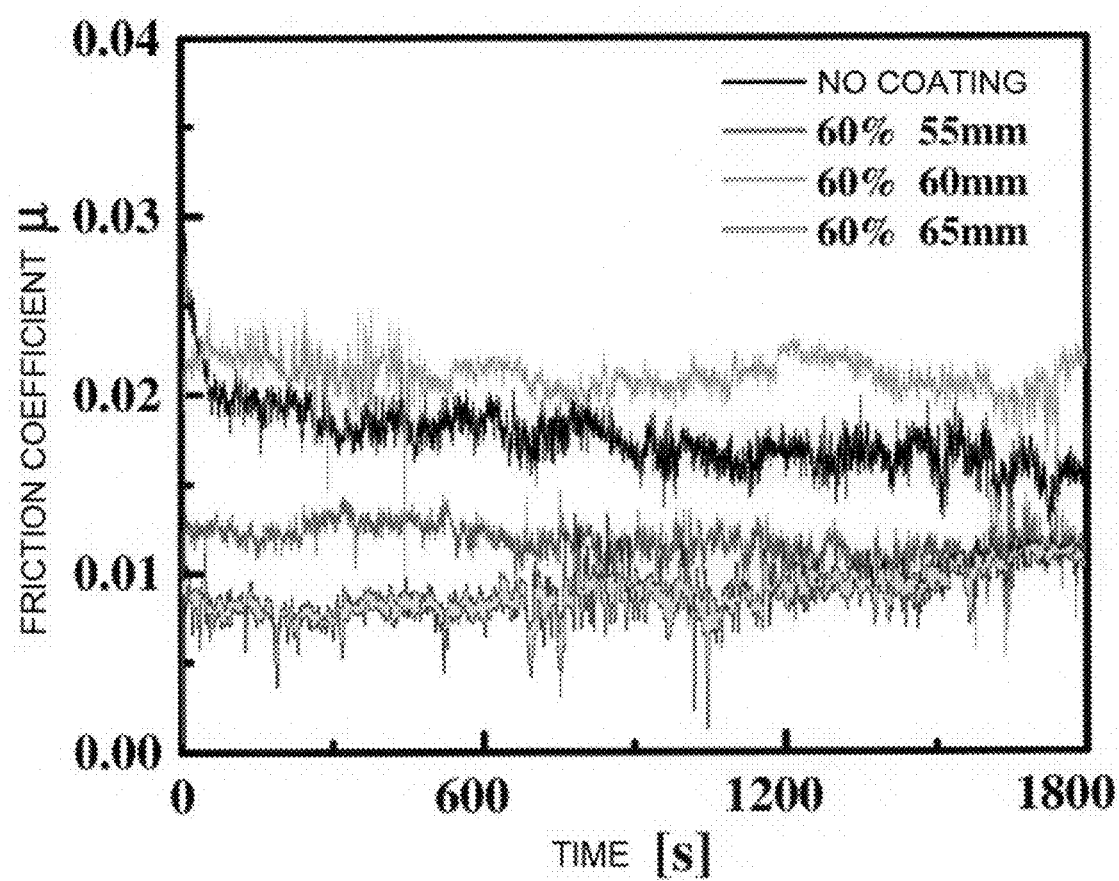
FIG. 6A is a graph illustrating temporal changes of friction coefficients of a bearing in oil incorporating the bearing ball with ZnO coating according to the example of the present invention prepared with use of the oxygen-and-argon-mixed sputter gas with the oxygen partial pressure ratio of 60% (distance h=55 mm, 60 mm, and 65 mm) in comparison with a case of the bearing incorporating a bearing ball with no ZnO coating.
Figure 6B:
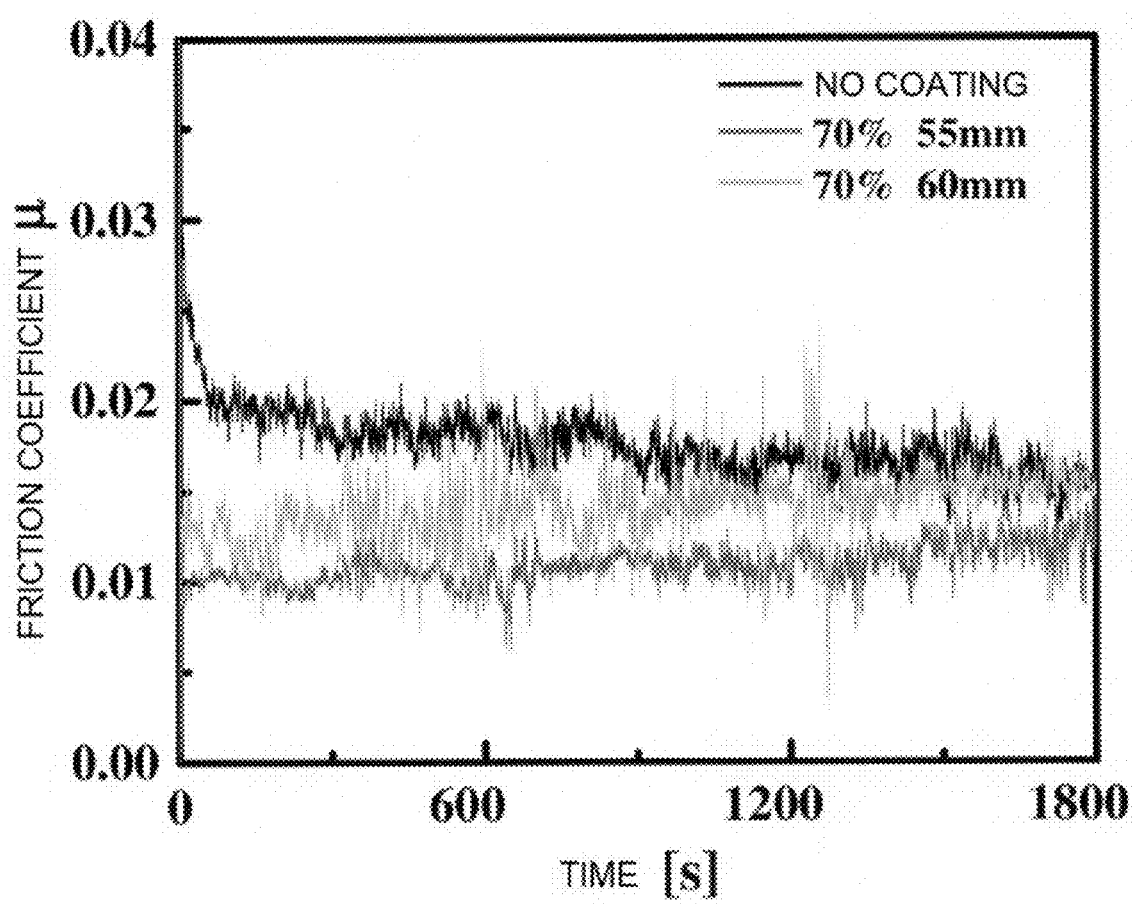
FIG. 6B is a graph illustrating temporal changes of friction coefficients of the bearing in oil incorporating the bearing ball with ZnO coating according to the example of the present invention prepared with use of the oxygen-and-argon-mixed sputter gas with the oxygen partial pressure ratio of 70% (distance h=55 mm and 60 mm) in comparison with a case of the bearing incorporating the bearing ball with no ZnO coating.
Figure 7:
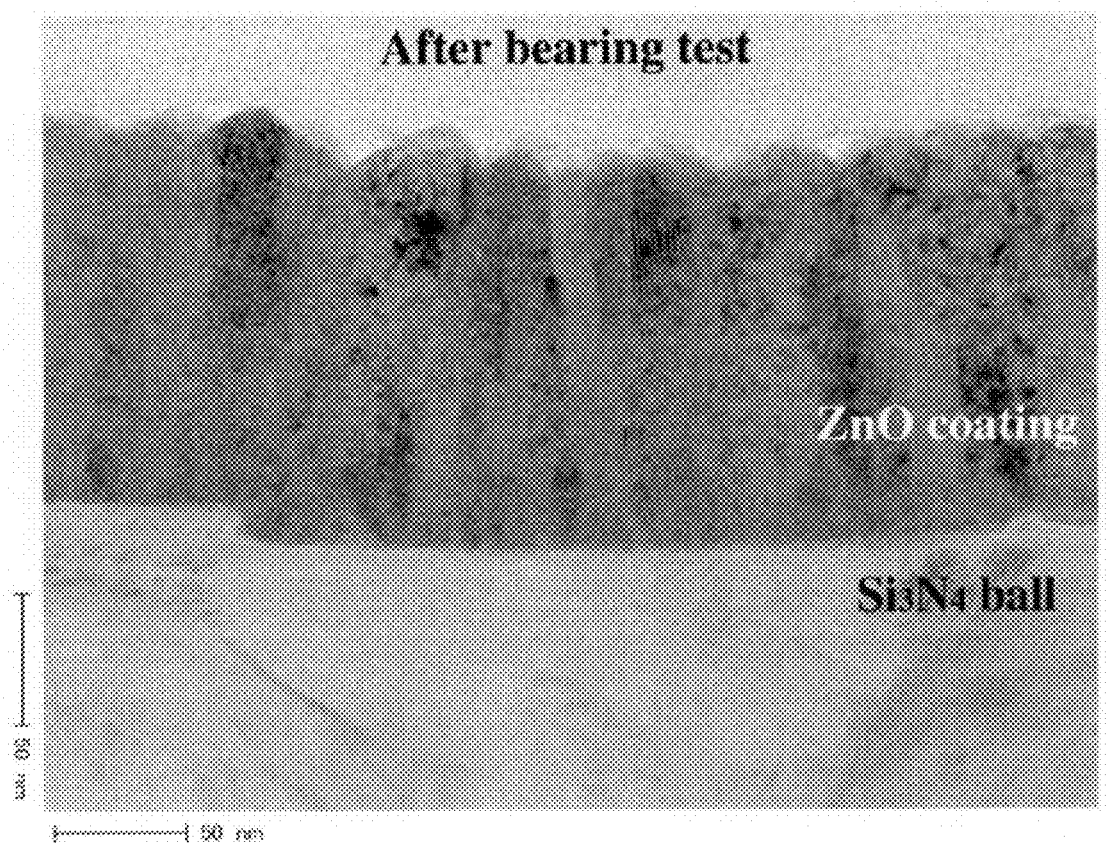
FIG. 7 is a cross-sectional TEM image of the bearing ball with ZnO coating prepared under the same conditions as those of the bearing ball illustrated in FIG. 3 after the bearing ball is tested by a friction tester.

Temporal change examples of a friction coefficient of the bearing in oil measured in the above manner are illustrated in FIGS. 6A and 6B. It was found that the friction coefficient in a case in which ZnO coating was provided (oxygen partial pressure ratio: 60%, h=55 mm, 60 mm, and 65 mm, illustrated in FIG. 6A) was lower than that in a case in which no coating was provided, and that a temporal change of the friction coefficient was smaller in the case of ZnO coating than that in the case of no coating, which meant the friction coefficient was more stable (a graph located at the lowest portion in FIG. 6A and surrounded by the thin line represents a case of h=65 mm although the graph is slightly less visible). A cross-sectional TEM image of the coating after the test is illustrated in FIG. 7, which illustrates an image "After bearing test." The disorder of the crystal orientation is less than that of the cross-sectional TEM image after the test in the jet engine. The thickness of the coating was reduced. Further, as illustrated in FIG. 6B, in a case in which the oxygen partial pressure ratio was 70%, effects of the ZnO coating were exerted such as further lowering of the friction coefficient and further reduction of the temporal change of the friction coefficient (stabilization) than in the case of no coating.

Figure 8B:
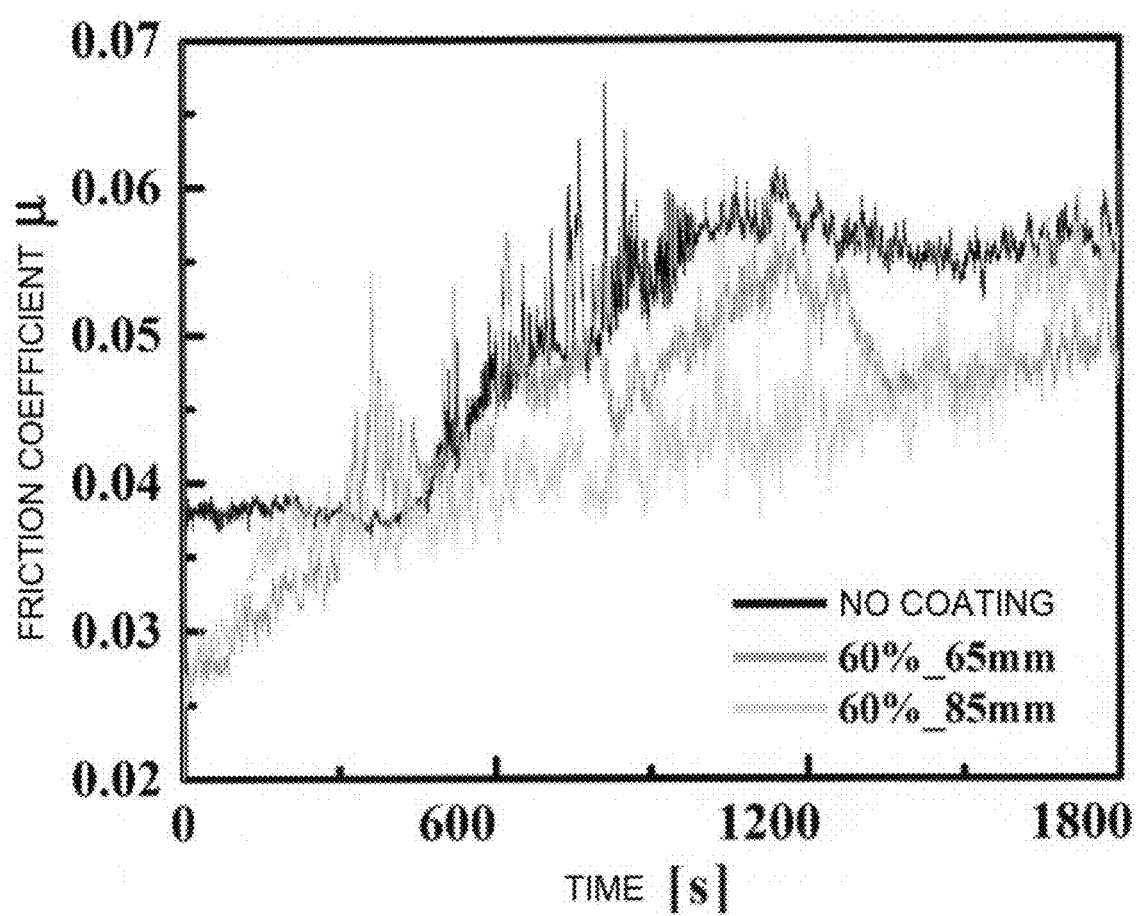
FIG. 8B is a graph illustrating temporal changes of friction coefficients of the bearing in air incorporating the bearing ball with ZnO coating according to the example of the present invention prepared with use of the oxygen-and-argon-mixed sputter gas with the oxygen partial pressure ratio of 60% (distance h=65 mm and 85 mm) in comparison with a case of the bearing incorporating the bearing ball with no ZnO coating.

As illustrated in FIGS. 8A to 8C, the effect of lowering of the friction was exerted in air as well. In this manner, the friction performance of the bearing ball with ZnO coating according to the present example is drastically improved both in oil and in air in comparison with that of the bearing ball with no coating. Furthermore, even in a case in which the coating film is abraded and disappears after prolonged use, use of the bearing containing $Si_3N_4$ ceramic balls, which is an original state, will then be started. The bearing ball with ZnO coating is extremely high in safety and can drastically improve the duration.

The following table shows friction coefficient values in a case in which the bearing ball with ZnO coating was used in air and in oil and friction coefficient values in a comparative example in which no coating was provided. It is to be noted that each of the friction coefficient values illustrated in the table is an average value of values in a flat region in which lowering of the friction coefficient becomes moderate (stable) after a lapse of 100 to 200 minutes from rotation of the bearing and start of measurement of the friction coefficient (that is, a region in which the temporal change of the friction coefficient on the graph is smaller).

TABLE 1

|  |  |  | Distance h between sputter gun and coated target [mm] | | | |
|---|---|---|---|---|---|---|
|  |  | Condition | 55 | 60 | 65 | 85 |
| Oxygen partial pressure ratio [%] | 60 | In air | 0.022 | 0.025 | 0.026 | 0.025 |
|  |  | In oil | 0.012 | 0.022 | 0.008 | — |
|  | 70 | In air | 0.026 | 0.031 | — | — |
|  |  | In oil | 0.01 | 0.012 | — | — |
| No coating |  | In air |  | 0.038 |  |  |
|  |  | In oil |  | 0.019 |  |  |

As can be seen from the above table, the oxygen partial pressure ratio and the distance h influence the friction coefficient of the ZnO coating. However, even in a case in which these parameters were changed, this did not have a large influence on the range of the ratio of the mesh size to the diameter of the rolling body which provided ZnO coating having a highly uniform and specular surface illustrated on the right side of FIG. 2, and when the ratio was in the range of 40 to 95%, favorable and specular ZnO coating was formed. That is, the oxygen partial pressure ratio and the distance h have an influence on the crystal orientation of ZnO forming the finished specular coating rather than on uniformity and fineness of the ZnO coating and thus have an influence on the friction coefficient. However, these parameters may slightly influence adhesion of the ZnO coating to a curved surface.

INDUSTRIAL APPLICABILITY

By applying the present invention to a bearing in a high-load and high-speed-rotation device such as a jet engine and a gas turbine, friction of the bearing can be lowered, and endurance under severe use conditions is improved, in comparison with a case of no ZnO coating. Accordingly, the present invention can greatly contribute to improvement in efficiency and duration of a rotating device of this kind.

CITATION LIST

Patent Literature

Patent Literature 1: JP 2010-209443 A

Non Patent Literature

Non Patent Literature 2: M. Goto et al., Jpn. J. Appl. Phys., 42, 4834-4836 (2003).
Non Patent Literature 2: M. Goto et al., Jpn. J. Appl. Phys., 47, 8914-8916 (2008).
Non Patent Literature 3: M. Goto et al., Tribology Lett., 43 (2) 155-162 (2011).
Non Patent Literature 4: Y. Miyakawa et al., Tribologist, 38 (1) 46-53 (1993).
Non Patent Literature 5: http://www.gmn.de/en/ball-bearings/products/deep-groove-ball-bearings/product-search.html
Non Patent Literature 6: http://www.matsuda-shouten.co.jp/productlist/shell/leaflet/aeroshell/AeroShell_Turbine_Oil_500.pdf

REFERENCE SIGNS LIST 1 bearing ball
2 basket
3 rotating shaft
4 sputter gun
10 bearing-dedicated jig
11 bearing shaft
12 housing
12a cylindrical portion
13 bearing
14 main shaft of upper rotation and load unit (friction tester)
20 bearing securing screw
21 bearing pulling screw
22 bearing pulling jig
23 bearing housing portion
24 jig securing screw

The invention claimed is:

1. A rolling body comprising a specular ZnO coating film on an entire surface thereof.

2. The rolling body according to claim 1, wherein the ZnO coating film has a columnar structure on a ZnO (002) face.

3. The rolling body according to claim 1, wherein the rolling body is formed in a shape selected from the group consisting of a sphere, a cylinder, and a truncated cone.

4. The rolling body according to claim 1, which is a rolling element for a bearing.

5. A bearing incorporating a rolling body according to claim 4.

6. A ZnO coating method for rolling body comprising performing ZnO sputtering while rotating a basket housing a rolling body to form a specular ZnO coating on a surface of the rolling body, wherein a ratio of a mesh size of the basket to a radius of the rolling body is in a range of 40% to 95%.

7. The ZnO coating method for rolling body according to claim 6, wherein the sputtering is performed by means of radio frequency magnetron sputtering.

8. The ZnO coating method for rolling body according to claim 6, wherein sputter gas made of oxygen and argon is used, and Zn is used as a target.

9. The ZnO coating method for rolling body according to claim 8, wherein an oxygen partial pressure ratio in the sputter gas is in a range of 60% to 80%.

10. The ZnO coating method for rolling body according to claim 9, wherein a vertical distance h from the basket to a sputter gun for performing the sputtering is in a range of 55 mm to 85 mm.

* * * * *